United States Patent [19]

Taravade

[11] Patent Number: 6,120,607
[45] Date of Patent: Sep. 19, 2000

[54] APPARATUS AND METHOD FOR BLOCKING THE DEPOSITION OF OXIDE ON A WAFER

[75] Inventor: Kunal N. Taravade, Colorado Springs, Colo.

[73] Assignee: LSI Logic Corporation, Milpitas, Calif.

[21] Appl. No.: 09/204,813

[22] Filed: Dec. 3, 1998

[51] Int. Cl.[7] .................................................. C23C 16/00
[52] U.S. Cl. .......................................... 118/720; 118/728
[58] Field of Search .................................. 118/715, 720, 118/728

[56] References Cited

U.S. PATENT DOCUMENTS

| | | | |
|---|---|---|---|
| 4,356,223 | 10/1982 | Iida et al. | 428/156 |
| 4,992,394 | 2/1991 | Kostelak, Jr. et al. | 437/229 |
| 5,188,876 | 2/1993 | Hensel et al. | 428/76 |
| 5,234,539 | 8/1993 | Schiltz et al. | 156/645 |
| 5,271,798 | 12/1993 | Sandhu et al. | 156/638 |
| 5,456,756 | 10/1995 | Ramaswami et al. | 118/721 |
| 5,516,721 | 5/1996 | Galli et al. | 437/67 |
| 5,614,446 | 3/1997 | Ramaswami et al. | 437/228 |
| 5,922,133 | 7/1999 | Tepman | 118/720 |

*Primary Examiner*—Richard Bueker

[57] ABSTRACT

An apparatus for use in the deposition of oxide on a wafer, the apparatus including a chamber for receiving oxygen gas that is used for forming the oxide on the wafer, the apparatus comprising: a wafer chuck located within the chamber, the wafer chuck capable of supporting the wafer during the deposition of oxide on the wafer; and an oxide blocking member located within the chamber and detached from the wafer, the oxide blocking member capable of preventing the deposition of oxide in at least one predetermined area of the wafer.

20 Claims, 6 Drawing Sheets

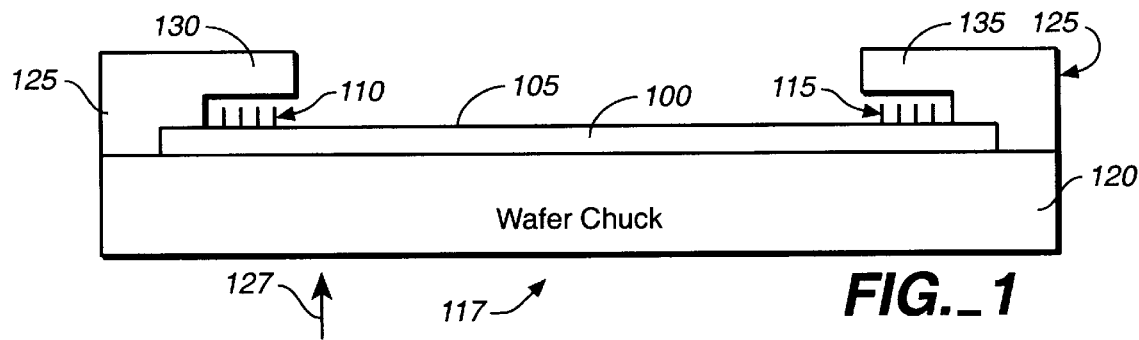
FIG._1
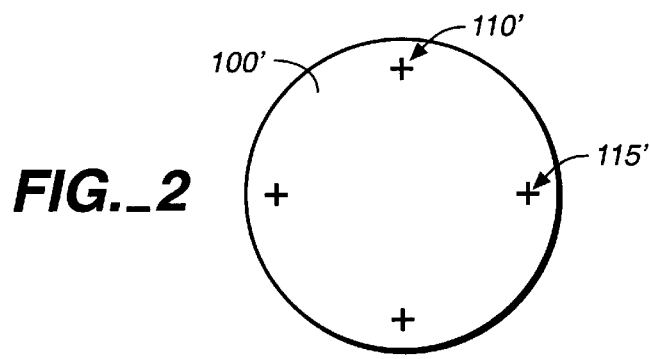
FIG._2
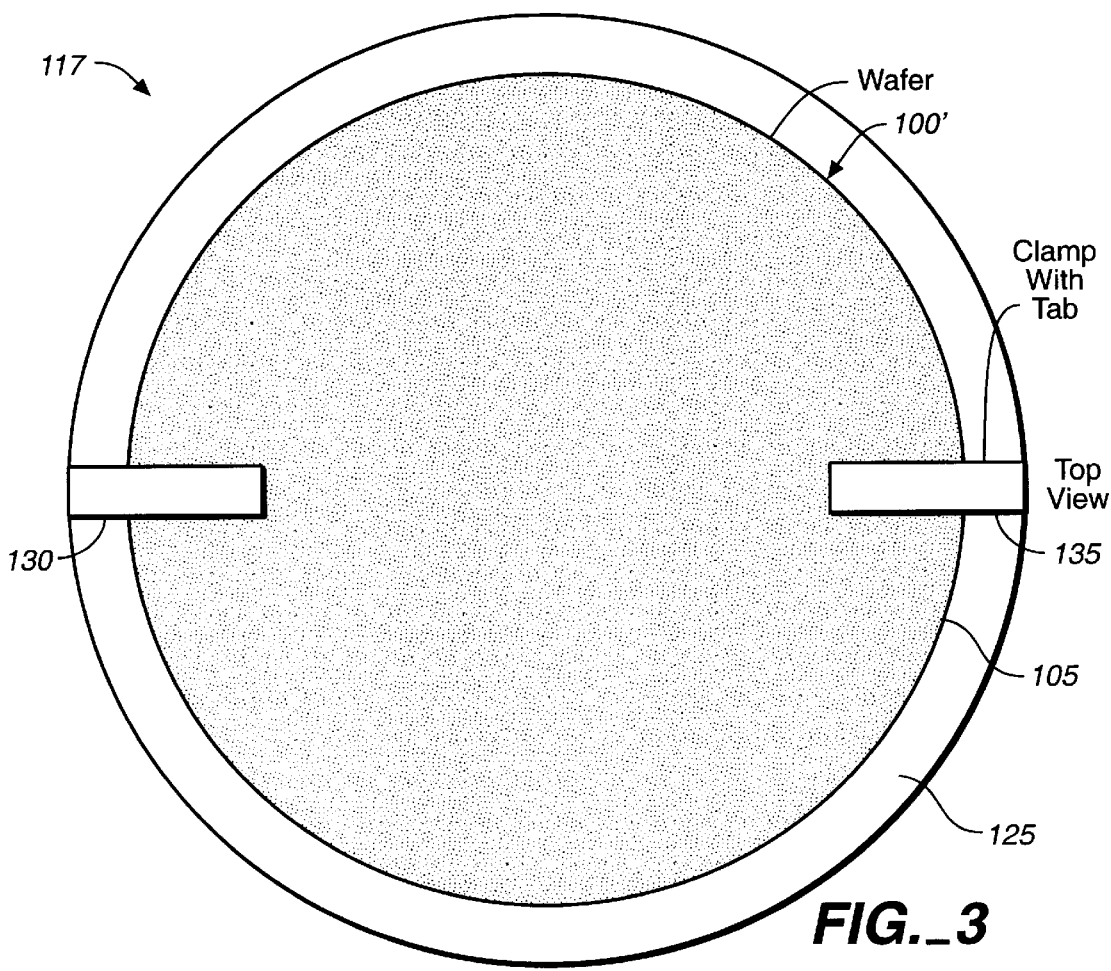
FIG._3

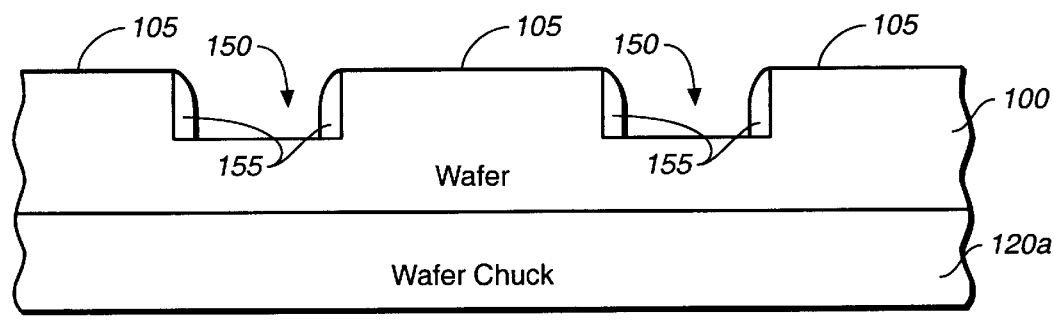
FIG._4
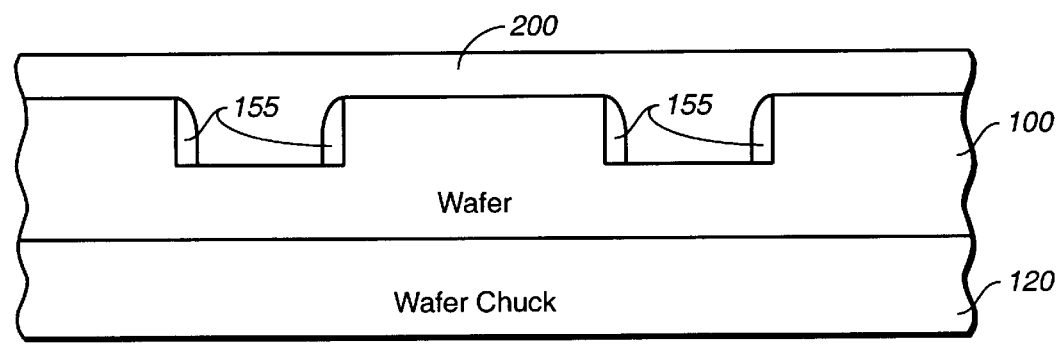
FIG._5
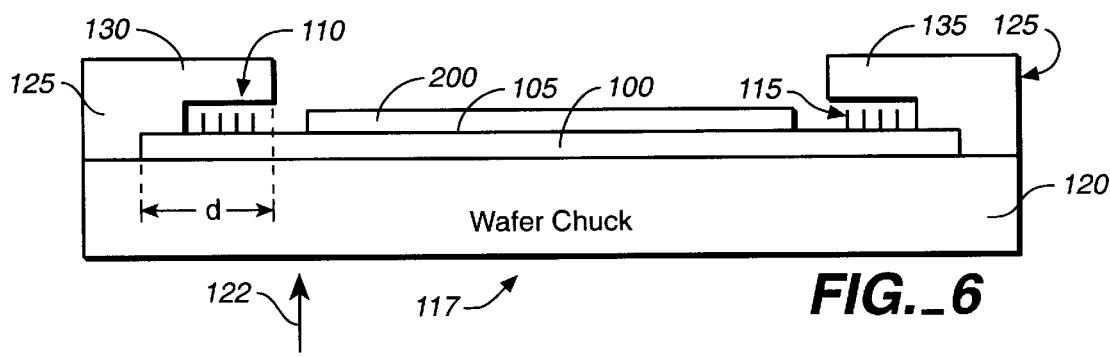
FIG._6

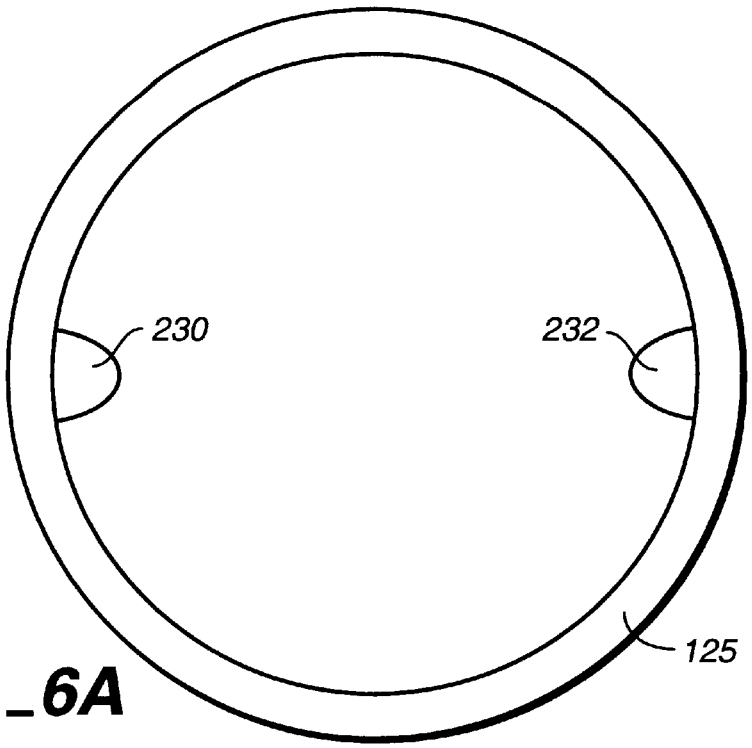
FIG._6A
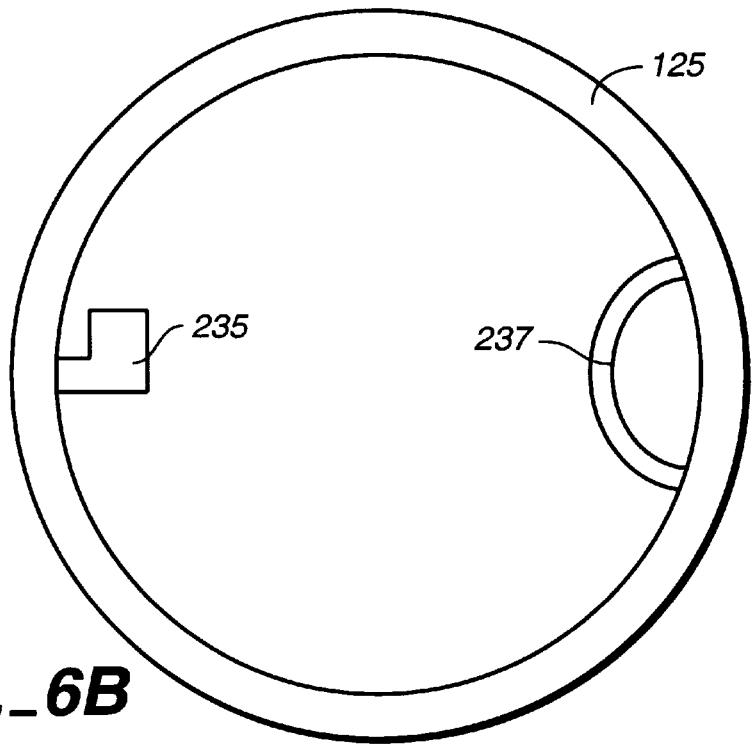
FIG._6B

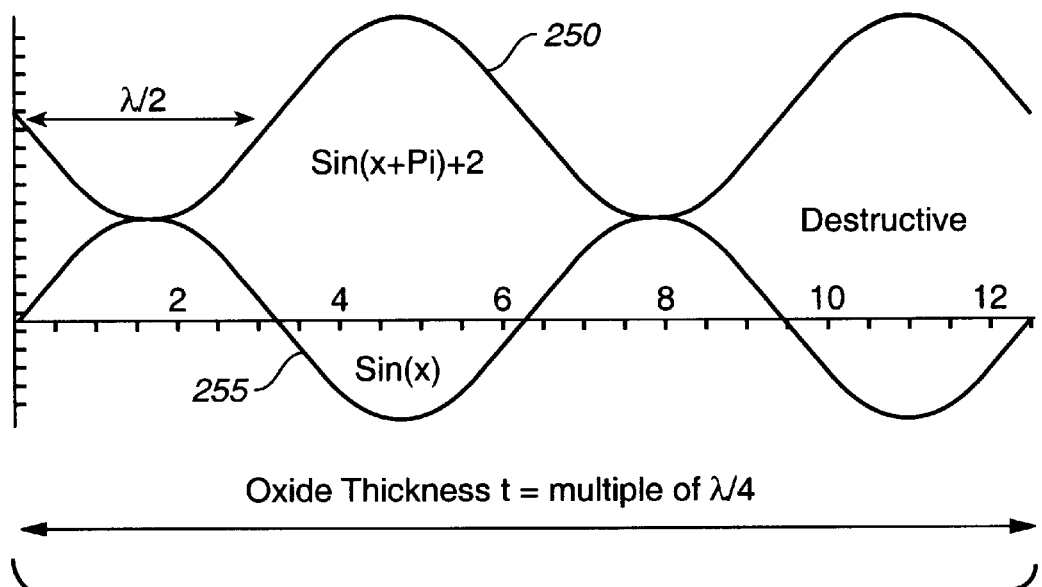
FIG._7
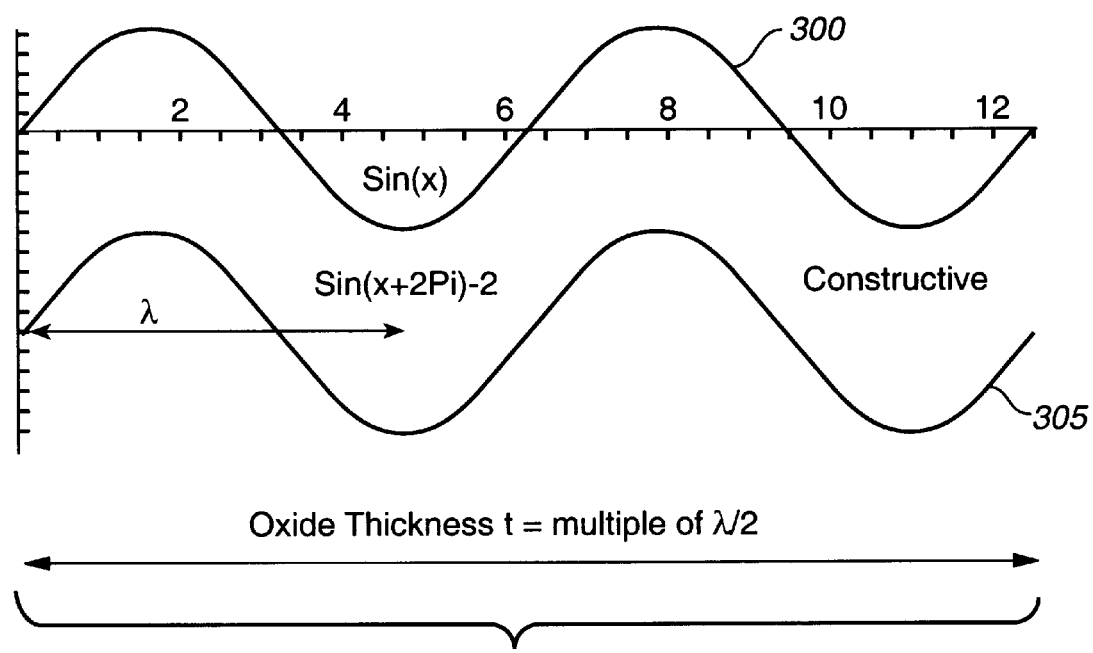
FIG._8

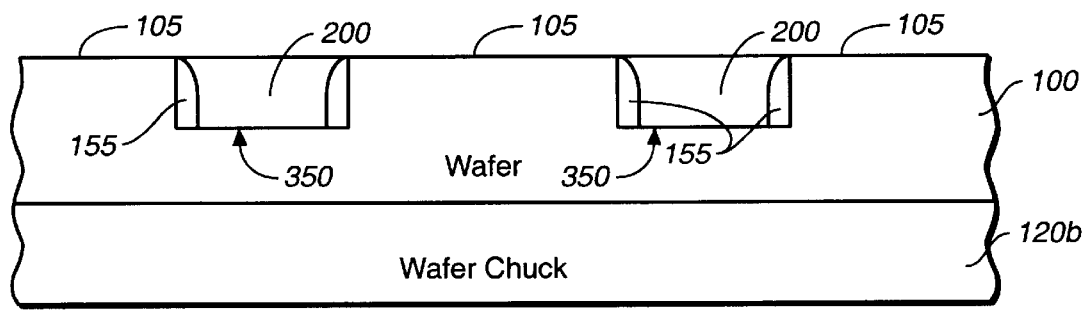
FIG._9
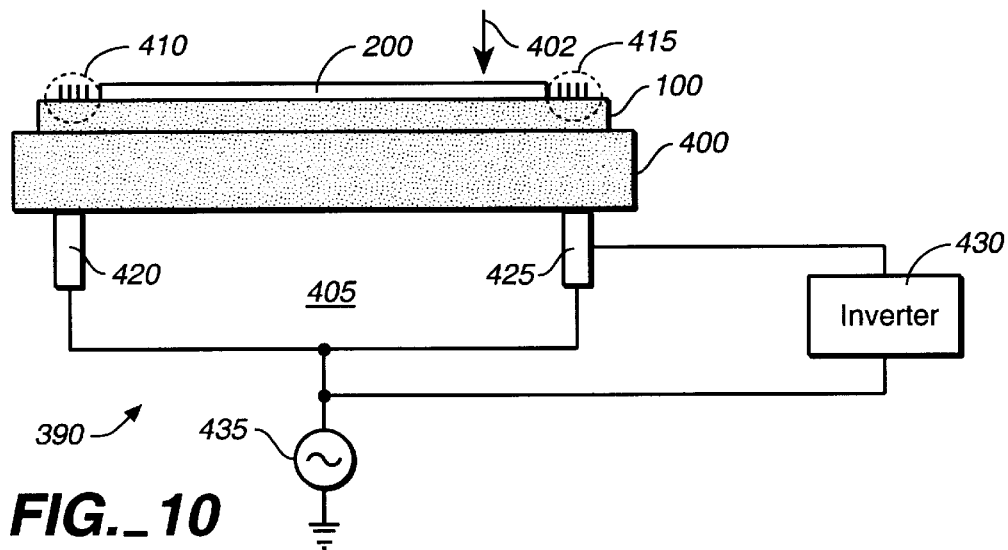
FIG._10
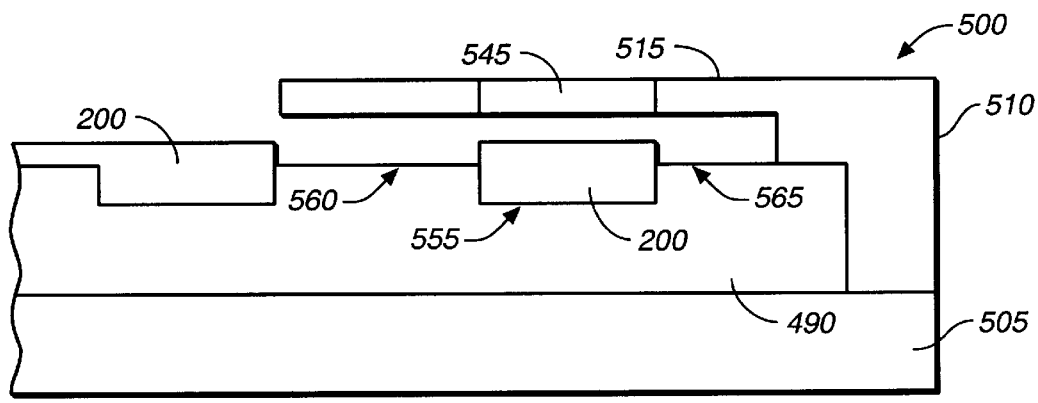
FIG._11

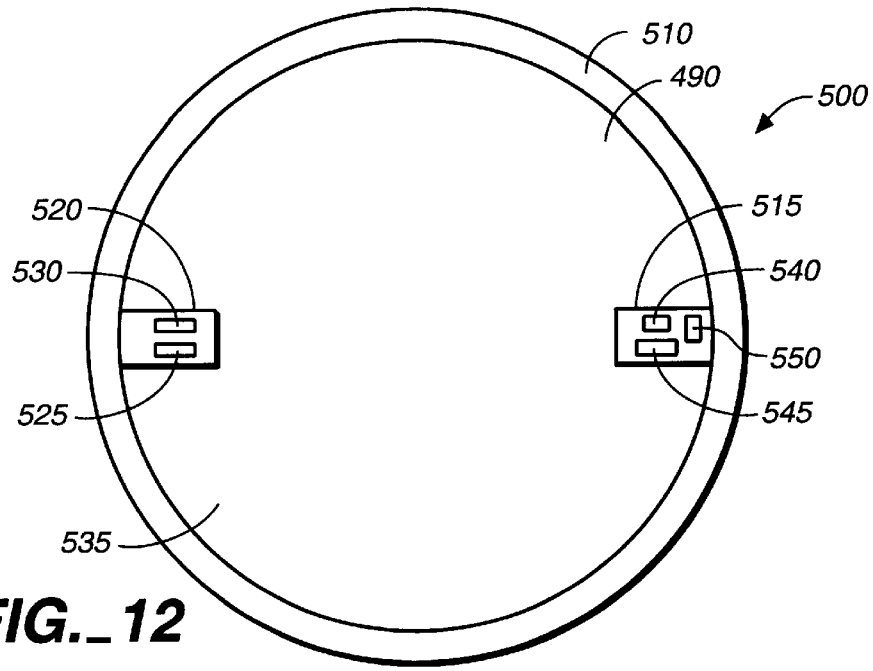
FIG._12
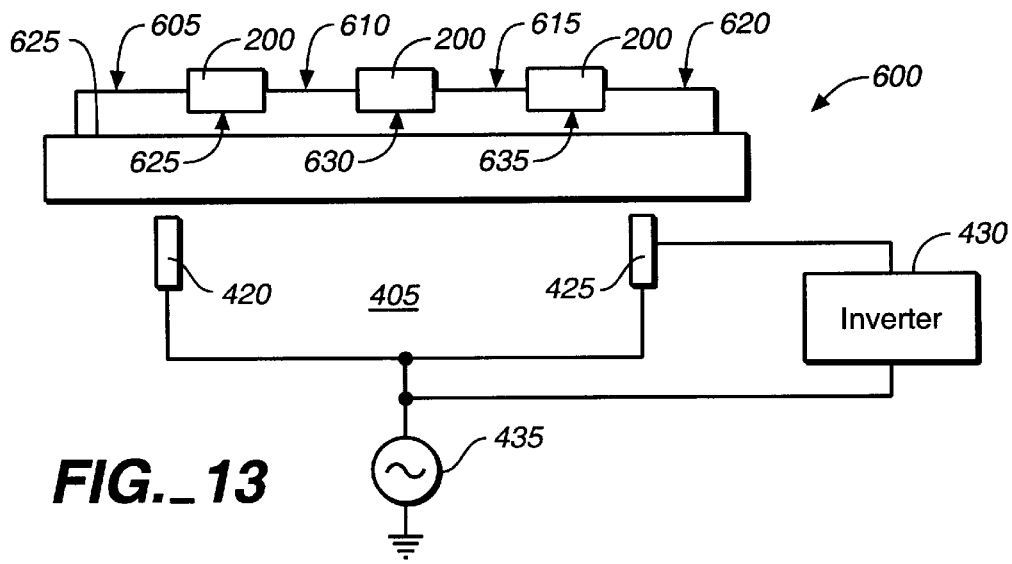
FIG._13
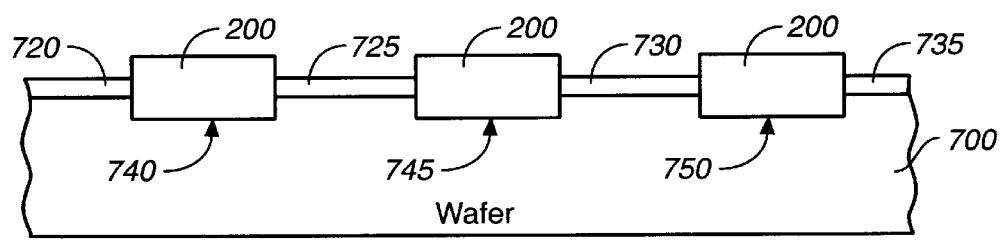
FIG._14 (PRIOR ART)

APPARATUS AND METHOD FOR BLOCKING THE DEPOSITION OF OXIDE ON A WAFER

BACKGROUND

1. Field of the Invention

This invention relates generally to the field of semiconductor processing and more specifically to oxide deposition during semiconductor fabrication.

2. Background of the Invention

Semiconductor integrated circuits (ICs) are typically fabricated by successively forming patterned layers on a top surface of a semiconductor wafer. The wafer is typically silicon, while each layer is composed of metals or insulators. Each layer is patterned by lithographic and etching techniques that are suitable for the layer material. A layer formed by metal is typically separated from another metal layer by an insulation layer such as oxide. Depending on the level of complexity, an IC will require from 5 to 18 different masks (i.e., "work plates") to create the layers of circuit patterns that must be formed on the surface of a silicon wafer. To begin the fabrication process, a silicon wafer is loaded into a 1200 Celsius furnace in which oxygen flows. As a result, a layer of silicon dioxide is "grown" on the surface of the wafer.

The oxidized wafer is then coated with a light-sensitive, honey-like emulsion known as a photoresist. Negative photoresist hardens when exposed to ultra-violet light. Suitable materials for the photoresist include materials that comprise novolac resin and a photo-active dissolution inhibitor. Other suitable materials may be used as a photoresist as known to those skilled in the art. The photoresist may have any suitable thickness, and is disposed by use of, for example, the spin coating method.

An appropriate glass mask is placed directly over the wafer to transfer the first layer of circuit pattern onto the wafer. During the photolithographic process, the mask is aligned relative to the wafer by use of a lithography system that typically includes subsystems such as a precision alignment system, a reticle alignment system, and an illumination system. An ultra-violet light is then projected through the mask, and the dark patterns on the mask conceal wafer areas that are aligned with the dark patterns. The photoresist areas (which are aligned with the dark mask patterns) do not receive the ultraviolet light and therefore remain soft. In contrast, the light hardens the other photoresist areas that receive the ultra-violet light passing through the mask.

The wafer is then washed in a solvent that removes the soft photoresist, but leaves the hardened photoresist on the wafer. The oxide layer is exposed in the areas in which the photoresist was removed. An etching bath then removes the exposed oxide areas and the remaining photoresist. The result is a stencil of the mask patterns, formed by minute channels of oxide and silicon. The wafer is then placed in a diffusion furnace for impurity doping whereby dopant atoms enter the areas of exposed silicon, forming a pattern of, for example, n-type material. An etching bath removes the remaining oxide and a new layer of silicon is deposited onto the wafer. Thus, the first layer of the chip is completed, and the masking process described above is repeated for the next mask.

Alignment marks are used to align a mask with a wafer. At least two alignment marks are required for global alignment that measures the position and orientation of the wafer. Alignment marks, known particularly as chip marks, are also required to determine shift, rotation, magnification, and trapezoidal corrections for each chip, and to correct for the placement of individual circuit patterns on the wafer.

However, alignment marks can be affected during the semiconductor fabrication process, thereby leading to misalignment between the mask and the entire wafer. For example, during shallow trench isolation (STI) an extra oxide deposition step is used to fill the shallow trenches between active areas of the wafer. This extra oxide deposition step is followed by chemical mechanical polishing that may adversely affect the wafer alignment marks.

As another example, during an oxide deposition step, an oxide layer typically forms over the alignment marks. Since the oxide layer may be transparent, the alignment marks may be visible to the alignment system. However, one problem is that certain thickness ranges of the oxide layer will cause destructive interference of the alignment beam from the alignment system whereby the alignment beam will cancel itself out as the beam reflects back from the alignment mark area to the alignment system. This destructive interference of the alignment beam may erroneously give a reading of precise alignment between the mask and the wafer when in fact there is misalignment.

Thus, there is a need for an apparatus and method for preserving alignment marks during the semiconductor fabrication process. What is further needed is an apparatus and method that prevent oxide deposition upon the alignment marks so that destructive interference of the alignment beam is prevented.

SUMMARY OF THE INVENTION

The present invention advantageously provides an apparatus and method for preserving alignment marks during the semiconductor fabrication process.

The present invention also advantageously eliminates the destructive interference problem for an alignment beam wherein the destructive interference problem occurs when oxide is formed on the alignment marks.

The present invention also advantageously provides an apparatus and method for minimizing any misalignment between a wafer and mask, without adding cost or increasing wafer processing time, by preventing oxide deposition on the alignment marks.

The present invention also advantageously provides an apparatus and method for patterning oxide growth on a wafer, without the need for subsequent etching steps that are required conventionally.

The present invention also advantageously provides an apparatus and method that can prevent oxide growth on various types of alignment marks.

The present invention provides the above advantages, as well as others, through an apparatus for use in the deposition of oxide on a wafer. The apparatus includes a chamber for receiving oxygen gas that is used for forming the oxide on the wafer. The apparatus comprises a wafer chuck located within the chamber, and the wafer chuck is capable of supporting the wafer during the deposition of oxide on the wafer. The apparatus further comprises an oxide blocking member located within the chamber and detached from the wafer. The oxide blocking member is capable of preventing the deposition of oxide in at least one predetermined area of the wafer.

BRIEF DESCRIPTION OF THE DRAWINGS

FIG. 1 is a side view of an oxide blocking member in accordance with a first embodiment of the present invention wherein the oxide blocking member includes retractable tabs for preventing oxide growth over alignment marks on a wafer;

FIG. 2 is a top view of the oxide blocking member of FIG. 1;

FIG. 3 is a top view of a wafer having alignment marks that are etched on the wafer surface;

FIG. 4 is a partial side view of a wafer cross section during shallow trench isolation;

FIG. 5 is a partial side view of a wafer cross section during shallow trench isolation whereby an oxide layer is deposited in the trenches which have been etched in the wafer;

FIG. 6 is a side view of the oxide blocking member of FIG. 1 whereby an oxide layer is formed on the wafer surface, while tabs prevent oxide growth on the alignment marks formed on the wafer;

FIG. 6A is a top view of an oxide blocking member wherein the tabs have a semi-circular configuration;

FIG. 6B is a top view of an oxide blocking member wherein the tabs have various configurations for blocking oxide;

FIG. 7 is a graph illustrating destructive interference of the alignment beam if an oxide layer having a thickness of $n(\lambda/4)$ is disposed upon an alignment mark of FIG. 1 wherein n is an odd integer;

FIG. 8 is a graph illustrating constructive interference of the alignment beam if an oxide layer having a thickness of $n(\lambda/2)$ is formed upon an alignment mark of FIG. 1 wherein n is an odd integer;

FIG. 9 is a partial side view of a wafer cross section during shallow trench isolation whereby an oxide layer (which has been deposited in the trenches) is planarized;

FIG. 10 is a side view of an oxide blocking member in accordance with a second embodiment of the present invention wherein the oxide blocking member comprises a charge distributor for creating a local charge distribution in areas of the alignment marks in the wafer so that oxide is repelled away from the alignment marks;

FIG. 11 is a side view of a cross section of an oxide blocking member in accordance with a third embodiment of the present invention wherein the oxide blocking member comprises at least one tab having at least one opening so tat an oxide layer can be grown in a desired pattern on a wafer;

FIG. 12 is a top view of the oxide blocking member of FIG. 11;

FIG. 13 is a side view of an oxide blocking member in accordance with a fourth embodiment of the present invention wherein the oxide blocking member comprises a charge distributor for creating a local charge distribution in predetermined areas of a wafer so that oxide is repelled away from the predetermined areas; and FIG. 14 is a side view of a cross section of a wafer whereby a protective layer or mask is used to prevent oxide deposition in wafer areas that are covered by the mask, as conventionally known.

DETAILED DESCRIPTION OF THE PREFERRED EMBODIMENTS

Referring in detail now to the drawings wherein similar parts or steps of the present invention are identified by like reference numerals, FIG. 1 illustrates a semiconductor wafer (or substrate) 100 with a surface 105 wherein the wafer 100 will ultimately contain many integrated circuit chips. The wafer 100 can be a wafer that is pure semiconductor, or a silicon on insulator (SOI) wafer that contains a thin layer of semiconductor material over an insulating layer, the insulating layer being disposed over a substrate. Alignment marks (or targets) 110 and 115 are formed along the edge of the wafer 100. For a six inch wafer, the alignment marks 110 and 115 are typically at a distance of about 0.4 inch to about 0.8 inch from the respective edge of the wafer 100. In FIG. 1, the alignment marks 110 and 115 are shown as steps, each having a height of, for example, about 1,000 Angstroms and a width of, for example, about 10 micron-meters. Each step is spaced apart from an adjacent step by, for example, about 10 micron-meters. Typically, the steps of alignment targets 110 and 115 are formed from tungsten. Any metal such as Aluminum (Al), Titaniun (Ti), Tungsten (W) or Copper (Cu) can be used. Typically Aluminum and Tungsten are used.

The alignment marks 110 and 115 in the wafer 100 may have other configurations. For example and as best shown in FIG. 2, a wafer 100' includes a plurality of alignment marks including alignment marks 110' and 115' which are etched pits in the wafer 110'. The alignment marks 110' and 115' are shaped as large crosses, each having a width ranging from, for example, about 2 micron-meters to about 6 micron-meters and a length ranging from, for example, about 100 micron-meters to about 200 micron-meters. Other suitable alignment mark configurations may be implemented in the wafer 100, as appreciated by those skilled in the art.

Referring now to FIGS. 1 and 3, there is seen a wafer chuck (support assembly) 120 and the wafer 100 placed upon the chuck 120. An oxide blocking member 117 includes a clamp (or clamp ring) 125 and tabs 130 and 135 attached to the clamp 125. The clamp 125 is coupled to a fixture in the process tool for performing the oxide deposition step and is typically constructed from titanium. Thus the clamp 125 is located within a furnace which receives oxygen gas for forming an oxide layer on the wafer 100 during an oxide deposition step. The wafer chuck 120 is shown for holding the wafer 100 during the oxide deposition step. After the wafer 100 is loaded onto the wafer chuck 120, the wafer chuck 120 will move in the direction of arrow 127 and press the wafer 100 against the clamp 125. Thus, the clamp 125 is used for securing the wafer 100 on the wafer chuck 120. The clamp 125 further includes tabs 130 and 135 for preventing deposition of oxide upon the wafer marks 110 and 115, respectively, as described hereinafter. The oxide blocking member 117 prevents oxide deposition by use of tabs. However, the oxide blocking member may also be implemented by use of a charge distribution system. For example, in FIG. 10 an oxide blocking member 390 is shown in accordance with another preferred embodiment of the invention. The oxide blocking member 390 comprises a charge distribution system (charge distributor) 405 that is used to prevent the deposition of oxide on predetermined or selected areas of the wafer 100.

Reference is now made to FIGS. 4 and 5 which illustrate a partial view of the wafer 100 during shallow trench isolation for purposes of illustrating an advantage of the present invention. The wafer 100 is placed on a chuck 120a that is partially shown in FIG. 4 and that is used during an etching step. The wafer 100 is slightly etched to create trenches 150 that will allow oxide to be disposed below the wafer surface 105. As an example, the trenches 150 can each have a depth ranging from about 2000 Angstroms (hereinafter "A") to about 5000 A and have a preferred depth of about 3500 A. A dry anisotropic etch may, for example, be used to form the precise trench patterns. Additionally, the sidewalls of the trenches 150 can be protected by a deposited nitride layer 155 to prevent lateral oxide growth. A nitride layer is first deposited in the trenches 150 and then etched into the protective nitride layers 155 shown in FIG. 4 by use of a reactive ion etch. The nitride layer 155 can have a thickness ranging from about 1000 A to about 2000 A and have a preferred thickness of about 1500 A. If the nitride layer 155 is not used, then there is an increase in probability of lateral encroachment into the wafer 100 by an oxide layer 200 (see FIG. 5) which is to be deposited into the trenches 150. A cleaning step may then follow whereby hydrogen gas, for example, is used.

As shown in FIG. 5, an oxide deposition step is then performed. Prior to the oxide deposition step, the wafer 100 is placed in a furnace (chamber) that is then filled with oxygen gas and that contains the wafer chuck 120 and clamp 125. The oxide layer 200 is grown under high pressure conditions wherein the pressure ranges from about $10^{-6}$ atmospheres to about $10^{-10}$ atmospheres and preferably about $10^{-8}$ atmospheres.

This oxide growth takes place at a temperature ranging from about 200 Celsius (C) to about 500C, preferably about 300C and lasts for a duration between about ½ minutes to about 3 minutes, preferably from about ½ minutes to about 2 minutes, and, most preferably, about 1 minute. The choices of temperature and oxide growth time length are dependent upon the desired thickness, physical results, and electrical results for the oxide layer 200.

Other conditions that must be controlled during the oxide growth step are the gas flows and gas ratios. Preferably, hydrogen (H2) is not used during the oxide growth step. If hydrogen is used, then the ratio of O2 to H2 is about 50, and preferably about 100, while nitrogen (N2) would not be typically introduced. Argon (Ar) is typically used for surface treatment and preconditioning, and also as an ambient gas during deposition. The ratio of O2 to Ar typically varies between 1 and 10, depending on the step in the deposition process, i.e. whether it is initial surface preparation (more Ar) or actual deposition (less Ar).

Alternatively, the oxide layer 200 is disposed on the surface 105 of wafer 100 by chemical vapor deposition or by other suitable well known methods.

Using the above described oxide growth process parameters, the oxide layer (or oxide region) 200 is formed with a thickness ranging from about 5000 A to about 7000 A. This thickness range is sufficient to fill in the shallow trenches 150 (see FIG. 4) between active areas in the wafer 100.

In accordance with a preferred embodiment of the present invention and as shown in FIG. 6, the tabs 130 and 135 will block oxide during the oxide deposition step and thus prevent oxide growth or formation over the wafer 100 regions which are covered by the tabs 130 and 135 during an oxide deposition step. The tabs 130 and 135 are directly above the alignment marks 110 and 115, respectively, and are sized to completely cover the alignment marks 100 and 115, thereby preventing oxide deposition on the alignment marks 110 and 115.

It is understood based upon the teachings of the present invention herein that the clamp 125 may be modified to included only one tab or to include other tabs in addition to those shown in FIG. 6. Additionally, the tabs described herein may be retractable. Thus, oxide may be chosen to form over an alignment mark (e.g., alignment mark 110) if a tab (e.g., tab 130) is retracted away from the alignment mark (e.g., alignment mark 110).

The tabs may be shaped in any suitable configuration to permit the deposition of oxide in various patterns. For example, in FIG. 6A the clamp 125 is modified to include the semi-circular clamps 230 and 232. Other suitable configurations include the tabs 235 and 237 in FIG. 6B.

The tabs disclosed herein may be formed from a material such as ceramic or high temperature quartz. In general, any non-metallic refractory substances can be used.

As a further alternative, the clamp 125 may be modified further so that deposition stops are used to prevent oxide deposition on the wafer alignment marks 110 and/or 115. Additionally, the present invention may be used to prevent oxide deposition on various types of pre-fabricated alignment marks on wafer substrates. It is further understood based upon the teachings of the present invention that the oxide blocking assemblies and methods described herein are not limited in applicability to shallow trench isolation. The oxide blocking assemblies and methods of the present invention may be applied in other oxide deposition steps of the semiconductor fabrication process.

Reference is now made to FIG. 7 to illustrate a prior art problem, which is eliminated by the present invention. Assume that the waveform 250 represents the ultraviolet light emitted by the alignment system (e.g., wafer stepper) wherein the waveform 250 represented by the equation (1).

$$\text{waveform } 250 = \operatorname{Sin}(x + Pi) + 2 \qquad (1)$$

Assume further that the parameter X represents one cycle of the waveform 250. If an oxide layer were formed upon the alignment marks 110 and/or 115 at a thickness of $n(\lambda/4)$ wherein $\lambda$ is the wavelength and n is any odd integer value greater than zero, then a waveform 255 is reflected back to the alignment system wherein the waveform 255 is represented by equation (2).

$$\text{waveform } 255 = \operatorname{Sin}(x) \qquad (2)$$

Thus, the waveform 255 will substantially cancel out waveform 250 and cause destructive interference when the waveform 255 is reflected from the wafer surface 105 to the alignment system. Otherwise stated, the waveform 250 will appear as very small or zero in value. This resulting destructive interference of the waveform 250 will typically prevent the alignment system from detecting a misalignment between a mask and the wafer 100. Furthermore, even assuming that the oxide layer 200 above the alignment marks 110 and/or 115 is transparent (thereby making the alignment marks 110 and 115 visible), the destructive interference will still occur as shown in FIG. 7 for the above mentioned oxide thickness values.

FIG. 8 shows a condition when destructive interference does not occur. Assume that the waveform 300 represents the ultra-violet light emitted by the alignment system wherein the waveform 300 is represented by the equation (3).

$$\text{waveform } 300 = \operatorname{Sin}(x) \qquad (3)$$

The parameter X represents one cycle of the waveform 300, as similarly described above. If an oxide layer were formed upon the alignment marks 110 and/or 115 at a thickness of $n(\lambda/2)$ wherein n is any integer value greater than, then a waveform 305 is reflected back to the alignment system wherein the waveform 305 is represented by equation (4).

$$\text{waveform } 305 = \operatorname{Sin}(x + 2Pi) - 2 \qquad (4)$$

Thus, destructive interference may not occur and the probability of misalignment is minimized. However, it is difficult to precisely achieve an oxide thickness of n(λ/2), and furthermore, oxide growth will typically vary across the surface of the wafer 100. In addition, an attempt to achieve an oxide thickness of n(λ/2) over the alignment marks 110 and/or 115 may lengthen and increase the cost of the fabrication process. The present invention provides an apparatus and method of minimizing any misalignment between the wafer 100 and a mask, without adding cost or increasing time in the fabrication process, by preventing oxide growth on the alignment marks 110 and 115.

Discussion is now turned to FIG. 9 which illustrates a global planarization step in order to show another advantage made possible by the present invention. As appreciated by those skilled in the art, global planarization is performed, for example, so that an underlying surface for a metallization layer is as flat or as planar as possible so that the overlying metallization layer is without discontinuities or other flaws. In FIG. 9, the global planarization step is performed to remove an undesired oxide layer 200 that have grown above the wafer surface 105. Chemical mechanical polishing (CMP) is used to remove the undesired oxide layer 200 above the wafer surface 105 so that isolation regions 350 are formed. The isolation regions 350 include the oxide layer 200 and are polished down to the same level as the wafer surface 105. Suitable polishing parameters and polishing consumable items may be used to achieve the final process characteristics.

However, the CMP step may adversely affect the wafer alignment marks 110 and 115. The present invention prevents oxide deposition upon the alignment marks 110 and 115, and thus during the CMP step. Although the alignment marks are transparent under a stack of oxide, the way the alignment system aligns these marks is complicated, and these complications can introduce certain problems. To cite an example, for oxide thicknesses that equal an odd integral multiple of the quarter wavelength of the light source used in the alignment system, the oxide stack causes destructive interference of the alignment signal, giving a small or zero alignment signal. Therefore, despite the fact that the marks may be "transparent" at the alignment wavelength for most oxide stack thicknesses, they may cancel out the alignment signal at certain thickness values, causing alignment problems. Preventing oxide deposition over marks at certain process levels (including before oxide CMP) that would cause the thickness to equal an odd multiple of the alignment quarter wavelength thus eliminates this problem.

Further, oxide over the marks may be adversely impacted by non-uniformity during processes such as CMP or oxide etch, rendering the topography of the alignment marks unusable for alignment. Blocking oxide deposition over alignment marks can circumvent this problem. Thus, the phase grating topography of the wafer alignment marks 110 and/or 115 is preserved.

FIG. 10 shows an oxide blocking member 390 for preventing oxide deposition on alignment marks in accordance with another embodiment of the present invention. The oxide blocking member 390 is particularly useful if it is not feasible to install clamps (rings) and/or tabs or deposition stops in the process tools or chambers that are used during an oxide deposition step. The wafer 100 is disposed on a chuck 400 that does not include a clamp assembly. The chuck 400 is typically a vacuum chuck, which is capable of exerting a vacuum force in the direction of arrow 402 so that the wafer 100 is held secure to the chuck 400. The oxide blocking member 390 includes a charge distributor 405, which will charge the wafer regions 410 and 415 to a first potential and will charge other regions of the wafer 100 to a second potential. The wafer regions 410 and 415 may be predetermined regions that include the alignment marks 110 and 115, respectively. The charge distributor 405 comprises coils 420 and 425, and an inverter 430. An AC voltage source 435 provides power to the charge distributor 405.

Alternately, elements 420 and 425 can be conducting cylinders embedded in the chuck.

So that oxide is repelled from the wafer regions 410 and 415, the AC source 435 is preferably a microwave source, with frequency on the order of several Giga Hertz (GHz), and adjustable power between 0 W and 3000 W.

Thus, the wafer regions 410 and 415 are appropriately charged by the charge distributor 405 so that oxide is repelled from the wafer regions 410 and 415 during chemical vapor deposition. The oxide layer 200 will form in other regions of the wafer 100, as shown in FIG. 10. Since the oxide layer 200 is not formed over the alignment marks 110 and 115, destructive interference of the alignment beam from the alignment system is prevented.

The oxide blocking assemblies 117 (FIG. 1) and 390 (FIG. 10) can also be used to pattern oxide depositions in desired patterns on predetermined areas of the wafer 490. For example, in FIGS. 11 and 12 an oxide blocking member 500 comprises a chuck 505, a clamp 510, and a plurality of retractable tabs including tabs 510 and 515, wherein the tabs 515 and 520 are both coupled to the clamp 510. The tab 520 may include openings 525 and 530, that expose the surface 535 of the wafer 490. Similarly, the tab 515 includes the openings 540, 545, and 550 that are formed on the tab 515 in desired sizes, configurations, and positions. As best illustrated in FIG. 11, the opening 545, for example, exposes the trench 555 so that an oxide layer 200 is formed in the trench 555 to create an isolation region. The tab 515 also prevents oxide deposition on the active areas 560 and 565, thereby leading to an advantage described hereinafter.

FIG. 13 shows an oxide blocking member 600 that has been configured to prevent oxide deposition upon active areas 605, 610, 615 and 620 of a wafer 625. The oxide blocking member 600 is implemented by modifying the charge distributor 405 of FIG. 10 to prevent oxide deposition in various predetermined areas of the wafer 625. Thus, the oxide layer 200 is grown only in the trenches 625, 630, and 635

The advantages of the present invention over conventional masking techniques are now discussed with particular reference to FIG. 14. A partial cross-sectional view of a wafer 700 is shown with protective layers (masks) 720, 725, 730, and 735 disposed in predetermined areas of the wafer 700 prior to formation of trenches 740, 745 and 750 between the protective layers 720, 725, 730, and 735. The protective layers 720, 725, 730, and 735 are each preferably silicon nitride and are formed on the wafer 700 by use of well known masking techniques. Thus, the oxide layer 200 is grown in the trenches 740, 745, and 750, while oxide growth is prevented in the wafer areas which are covered by the protective layers 720, 725, 730, and 735. Planarization is then applied to remove undesired portions of the oxide layer 200. The prior art then requires an extra step of removing the protective layers 720, 725, 730, and 735 by use of, for example, wet chemical etch or dry plasma etch.

In contrast, the present invention does not require the use of protective layers to block oxide in predetermined areas of the wafer. The oxide blocking assemblies 500 (FIG. 11) and 600 (FIG. 13) permit blocking of oxide during oxide deposition without use of protective layers or masks which are formed on the wafer. Thus, the present invention advantageously avoids the extra etching step of removing the prior art masks formed on the wafer surface. Therefore, the present invention can achieve a reduction in processing time and costs by eliminating subsequent etching or photolithographic steps that are required in the prior art.

Other advantages that are achieved by the present invention as a result of the capability of patterning oxide are that it possible to make multiple device configurations on one wafer without extra masking steps.

While the invention has been described in connection with what is presently considered to be the preferred embodiments, it is understood that the invention is not limited to the disclosed embodiments. For example, each of the features described above can be used singly or in combination, as set forth below in the claims, without other features described above which are patentably significant by themselves. Accordingly, the present invention is intended to cover various modifications and equivalent arrangements included within the spirit and scope of the appended claims.

What is claimed is:

1. An apparatus for use in the deposition of oxide on a wafer, the apparatus including a chamber for receiving oxygen gas that is used for forming the oxide on the wafer, the apparatus comprising:

a wafer chuck located within the chamber, the wafer chuck capable of supporting the wafer during the deposition of oxide on the wafer; and an oxide blocking member located within the chamber and detached from the wafer, the oxide blocking member capable of preventing the deposition of oxide in at least one predetermined area of the wafer, the oxide blocking member comprising;

a clamp for securing the wafer to the wafer chuck; and a tab coupled to the clamp and disposed above the predetermined area of the wafer so that the tab prevents the deposition of oxide in the predetermined area of the wafer.

2. An apparatus according to claim 1 wherein the tab includes an opening that permits oxide to be formed in a selected portion of the predetermined area of the wafer.

3. An apparatus according to claim 1 wherein the predetermined area of the wafer includes an alignment mark.

4. An apparatus according to claim 3 further comprising:

a second tab coupled to the clamp and disposed above a second predetermined area of the wafer so that the second tab prevents the deposition of oxide in the second predetermined area of the wafer.

5. An apparatus according to claim 4 wherein the second predetermined area of the wafer includes a second alignment mark.

6. An apparatus according to claim 4 wherein the second tab is retractable.

7. An apparatus according to claim 4 wherein the second tab includes an opening that permits oxide to be formed in a selected portion of the second predetermined area of the wafer.

8. An apparatus according to claim 1 wherein the tab is retractable.

9. An apparatus according to claim 1 wherein the oxide blocking member comprises:

a charge distributor, including a voltage source and plurality of coils coupled to the voltage source, the charge distributor capable of charging the predetermined area of the wafer to a first potential that prevents the formation of oxide in the predetermined area, the charge distributor further capable of charging other areas of the wafer to a second potential different from the first potential that permits the formation of oxide in the other areas of the wafer.

10. An apparatus according to claim 9 wherein the charge distributor is capable of charging a second predetermined area of the wafer to the second potential to prevent oxide formation in the second predetermined area.

11. A process tool for use during the deposition of oxide on a wafer, the process tool comprising:

a wafer chuck for supporting the wafer; and an oxide blocking member detached from the wafer and capable of preventing the formation of oxide on a predetermined area of the wafer, the oxide blocking member comprising;

a clamp capable of holding the wafer to the wafer chuck; and a tab coupled to the clamp and disposed above the predetermined area of the wafer so that the tab prevents the formation of oxide in the predetermined areas of the wafer.

12. A process tool according to claim 11 wherein the predetermined area of the wafer includes an alignment mark.

13. An apparatus according to claim 12 further comprising:

a second tab coupled to the clamp and disposed above a second predetermined area of the wafer so that the second tab prevents the deposition of oxide in the second predetermined area of the wafer.

14. An apparatus according to claim 13 wherein the second predetermined area of the wafer includes a second alignment mark.

15. An apparatus according to claim 13 wherein the second tab is retractable.

16. An apparatus according to claim 13 wherein the second tab includes an opening that permits oxide to be formed in a portion of the second predetermined area of the wafer.

17. An apparatus according to claim 11 wherein the tab is retractable.

18. An apparatus according to claim 11 wherein the tab includes an opening which permits oxide to be formed in a portion of the predetermined area of the wafer.

19. An apparatus according to claim 11 wherein the oxide blocking member comprises:

a charge distributor, including a voltage source and plurality of coils coupled to the voltage source, the charge distributor capable of charging the predetermined area of the wafer to a first potential that prevents the formation of oxide in the predetermined area, the charge distributor further capable of charging other areas of the wafer to a second potential different from the first potential that permits the formation of oxide in the other areas of the wafer.

20. An apparatus according to claim 19 wherein the charge distributor is capable of charging a second predetermined area of the wafer to the second potential to prevent oxide formation in the second predetermined area.

* * * * *